United States Patent
Hsu

(10) Patent No.: US 9,685,721 B2
(45) Date of Patent: Jun. 20, 2017

(54) ELECTRICAL CONNECTOR ASSEMBLY

(71) Applicant: FOXCONN INTERCONNECT TECHNOLOGY LIMITED, Grand Cayman (KY)

(72) Inventor: Shuo-Hsiu Hsu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 219 days.

(21) Appl. No.: 14/709,495

(22) Filed: May 12, 2015

(65) Prior Publication Data

US 2015/0349441 A1    Dec. 3, 2015

(51) Int. Cl.
| H01R 12/70 | (2011.01) |
| H01R 13/629 | (2006.01) |
| H01R 12/71 | (2011.01) |
| H05K 7/10 | (2006.01) |

(52) U.S. Cl.
CPC ..... *H01R 12/7058* (2013.01); *H01R 12/7076* (2013.01); *H01R 12/716* (2013.01); *H01R 13/62966* (2013.01); *H05K 7/1061* (2013.01)

(58) Field of Classification Search
CPC ...................... H01R 12/7058; H01R 13/62966
See application file for complete search history.

(56) References Cited

U.S. PATENT DOCUMENTS

| 2010/0184314 A1* | 7/2010 | Yeh | H01R 12/88 439/157 |
| 2011/0287639 A1* | 11/2011 | Hsu | H05K 7/1007 439/68 |
| 2014/0106593 A1* | 4/2014 | Hsu | H05K 7/1053 439/331 |
| 2015/0349441 A1* | 12/2015 | Hsu | H01R 12/7076 439/68 |
| 2016/0006170 A1* | 1/2016 | Hsu | H01R 13/62 439/345 |
| 2016/0197421 A1* | 7/2016 | Hsu | H01L 23/40 439/68 |

* cited by examiner

*Primary Examiner* — James Harvey
(74) *Attorney, Agent, or Firm* — Wei Te Chung; Ming Chieh Chang

(57) ABSTRACT

An electrical connector assembly, comprises a first connector, and a second connector mounted onto the first connector, a frame surrounding the connectors, a locking member, an actuator, a first lever assemble the locking member to the frame, and a second lever assemble the actuator to the frame. The locking member locks the second lever, a user must firstly press the first lever to make the locking member release the second lever, and next press the second lever to bring the actuator rotate, and then the actuator upwardly push the second connector to apart the second connector from the first connector.

20 Claims, 7 Drawing Sheets

ELECTRICAL CONNECTOR ASSEMBLY

BACKGROUND OF THE INVENTION

1. Field of the Invention

The present invention relates to electrical connector assembly, more particularly to an electrical connector assembly adapted for electrically connecting an IC package to a printed circuit board.

2. Description of Related Art

Current electrical connector assembly, adapted for high speed signals transmitting between IC packages, comprises a first body mounted on the printed circuit board and a second body engaging with the first body and supporting the IC package. A heat sink is assembled above the IC package. The first body has a housing and a plurality of first contacts received in the housing, which are soldered on the printed circuit board via solder balls to electrically connect the first body and the printed circuit board. The second body has an insulative base and a plurality of second contacts received in the insulative base, which are soldered on the IC package via solder balls to electrically connect the second body and the IC package. And the first body electrically conducts with the second body so as to electrically connect the first and the second bodies. The electrical connector assembly retains the heat sink by a lever, however, sometimes the lever is operated by mistake and causes the heat sink can not work normally.

An improved electrical connector assembly is desired.

BRIEF SUMMARY OF THE INVENTION

According to one aspect of the present invention, an electrical connector assembly, adapted for receiving an IC package, comprising a first body, a second body, a frame surrounding the first and the second bodies, a locking member, an actuator, a first lever and a second lever. The second body is mounted onto the first body and used for receiving the IC package. The locking member has a main body defining a first circular hole; the first lever pass through the first circular hole of the locking member to pivot the locking member and itself to an end of the frame. The actuator defines a second circular hole and being locked by the locking member; and the second lever pass through the second circular hole of the actuator to pivot the actuator and itself to an end of the frame. A downwardly movement of the first lever releases the actuator from the locking member and a further downwardly movement of the second lever bring the actuator to upwardly push the second body from the first body.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
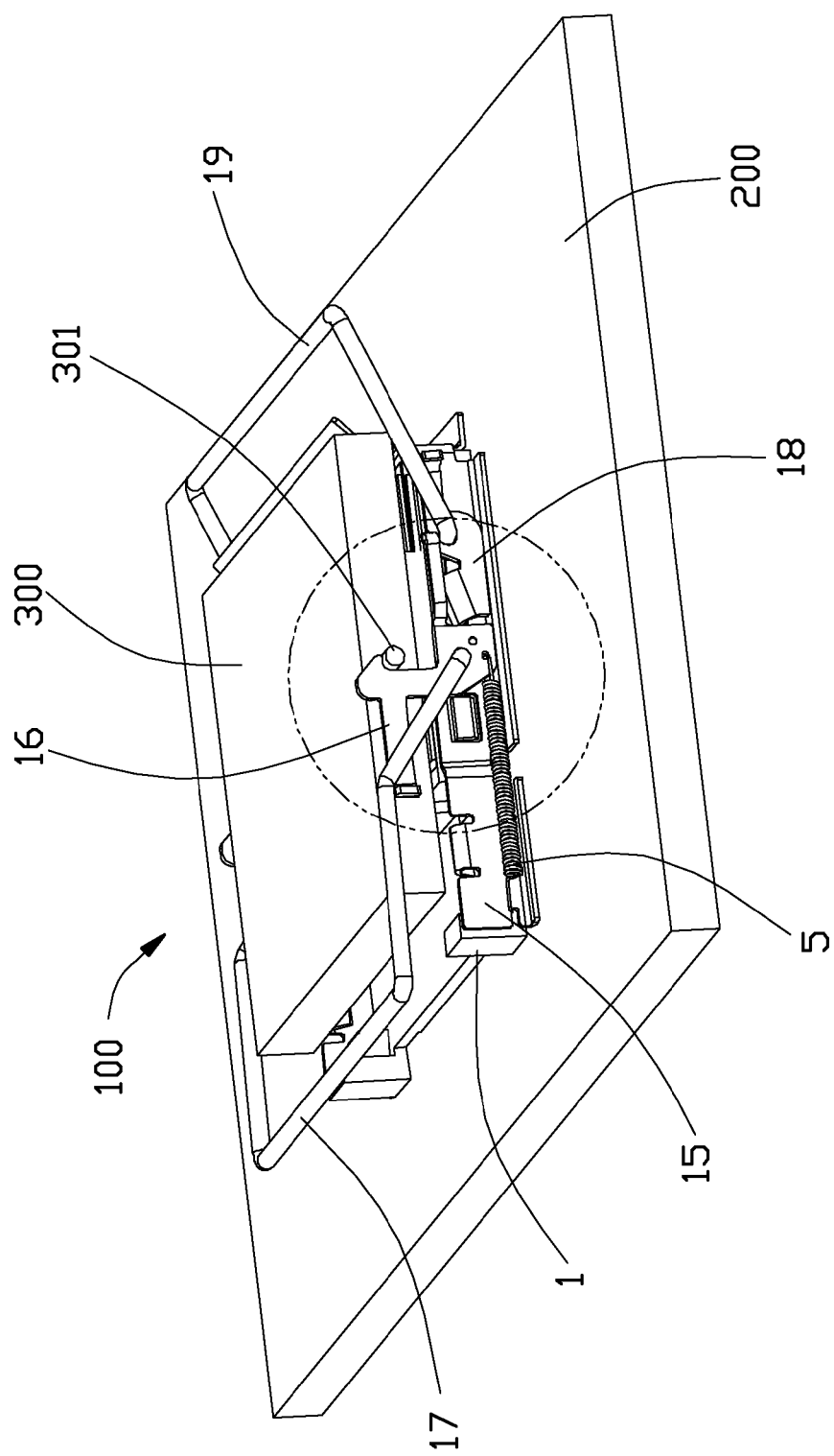
FIG. 1 is an assembled, perspective view of the electrical connector assembly mounted to a printed circuit board in accordance with present invention and a pressing member loaded on the electrical connector assembly.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Reference will be made to the drawing figures to describe the present invention in detail, wherein depicted elements are not necessarily shown to scale and wherein like or similar elements are designated by same or similar reference numeral through the several views and same or similar terminology.

The electrical connector assembly 100 as show in FIGS. 1-7, is used for electrically connecting an IC package (not shown) to a printed circuit board 200. The IC package (not shown) is received in the electrical connector assembly 100, and a pressing member 300 is mounted above the IC package to disperse heats.

Figure 2:
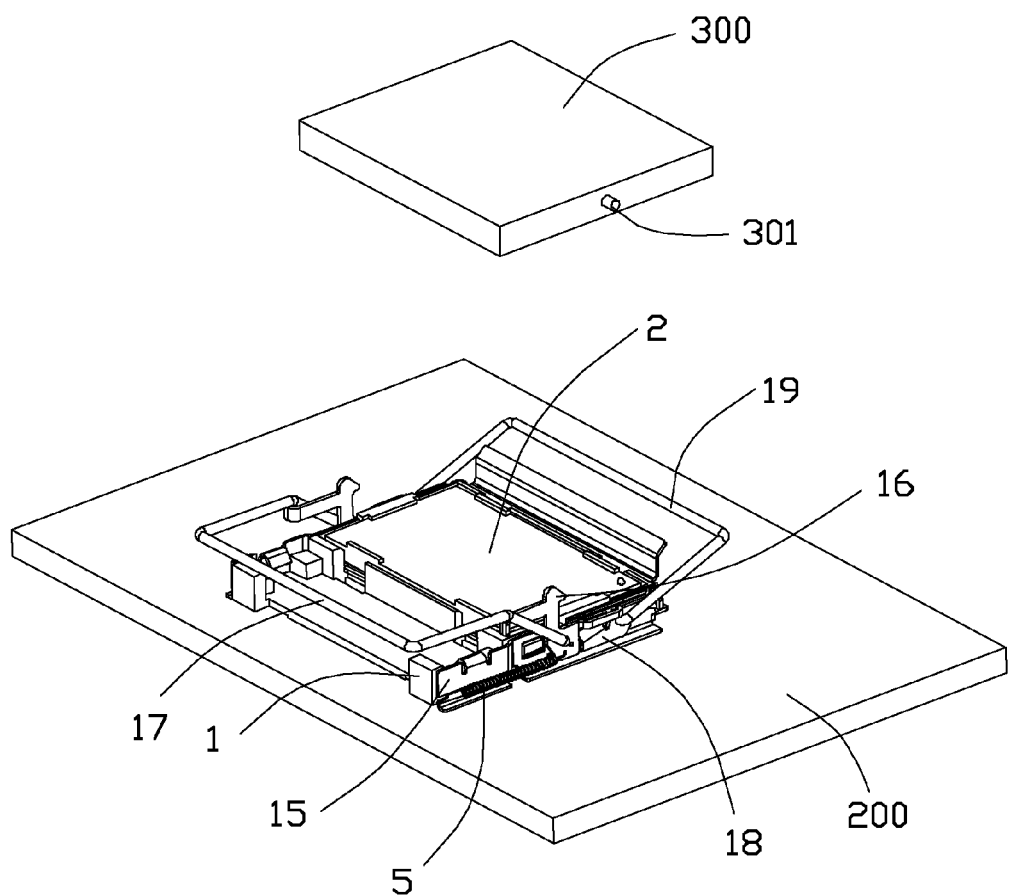
FIG. 2 is another assembled, perspective view of the electrical connector assembly, and the pressing member apart from the electrical connector assembly.
Figure 3:
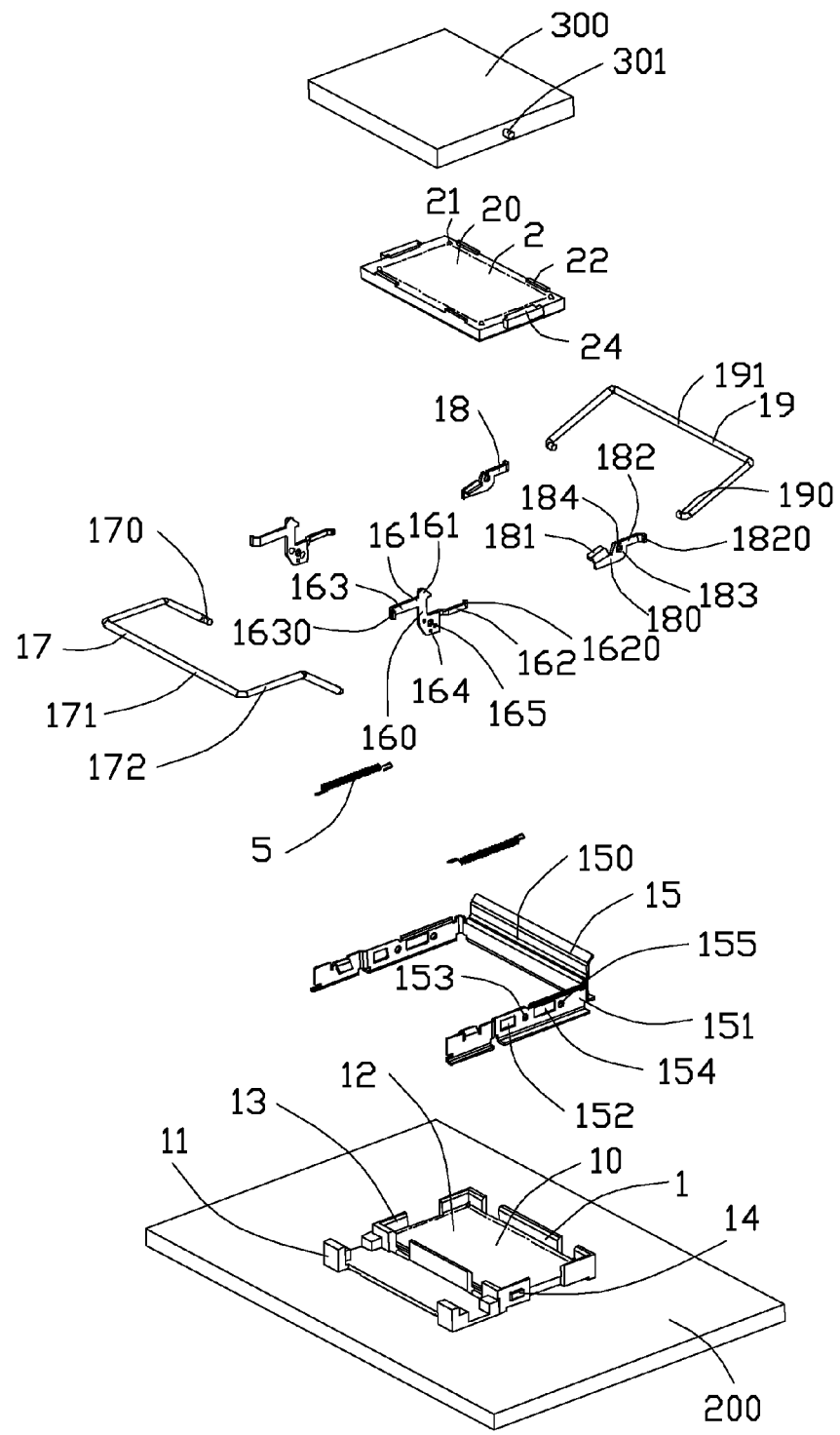
FIG. 3 is an explored, perspective view of the electrical connector assembly.
Figure 4:
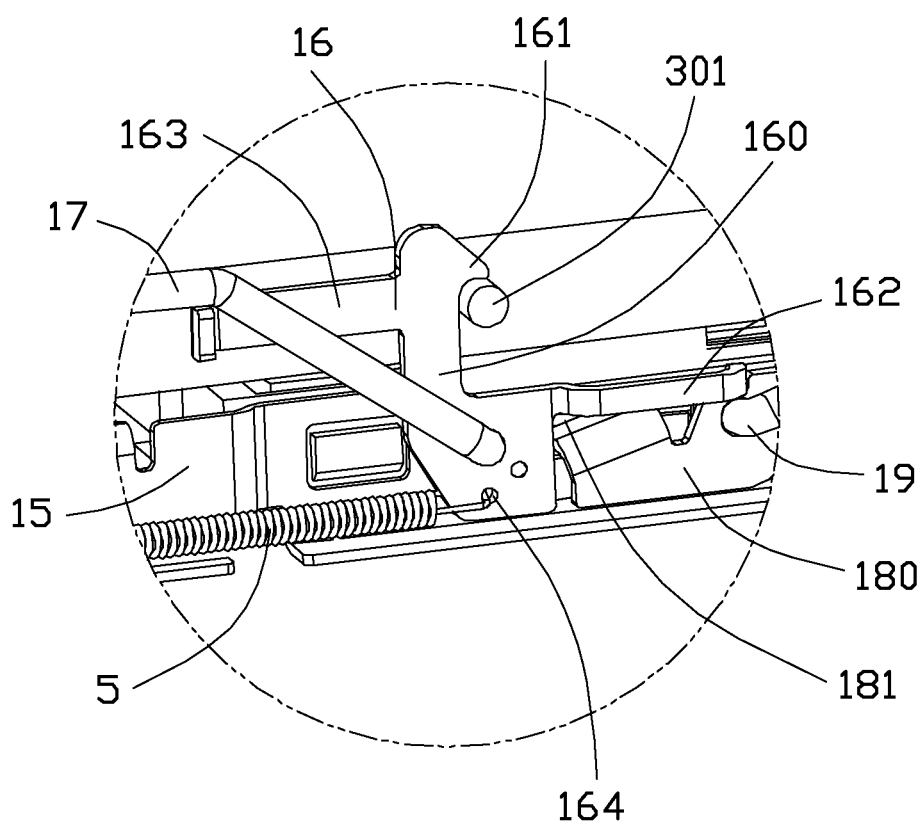
FIG. 4 is an enlarged view of a part of the electrical connector assembly in a circuit line of FIG. 1.

Referring to FIGS. 1-3, the electrical connector assembly 100 has a first connector 1 mounted to a printed circuit board 200, and a second connector 2 mounting onto the first connector 1, and a frame 15 surrounding the first and the second connector 1, 2. The electrical connector assembly 100 further has a first lever 17, a second lever 19, two locking members 16 rotatably assembled on two sides of the frame 15 via the first lever 17 pivoting to the frame 15, two actuator members 18 rotatably assembled on two sides of the frame 15 via the second lever 19 pivoting to the frame 15 and two spring 5 retained between the locking members 16 and the frame 15. An improvement of present invention is provide a mechanism and corresponding method to apart the two elements mounted together, so the first and the second connectors 1, 2 also can be other elements without contacts, which can be called first and second bodies.

The first connector 1 has a longitudinal body 10, a plurality of receiving holes 12 passing through the body 10 along a top to bottom direction, a peripheral sidewall 13 extending upwardly from a peripheral of the body 10, a plurality of ribs 14 formed on an outside of the sidewall 13 and two protrusions 11 protruding outwardly from two opposite ends of a side of the side wall 13. A plurality of first contacts (not shown) are received in the receiving holes 12.

The second connector 2 defines a top surface for loading the IC package (not shown), has a longitudinal body 20, a plurality of receiving slots 21 passing through the body 20 along the top to bottom direction, and a plurality of positioning portions 22 and two clumps 24. The two clumps 24 protrude upwardly and outwardly from two opposite edges of the body 20, respectively, for positioning the IC package (not shown). The receiving slots 21 of the second connector 2 are aligned with corresponding receiving holes 12 of the first connector 1. A plurality of second contacts (not shown) are received in the receiving slots 21, and mates with the first contacts of the first connector 1.

The frame 15 is formed by metallic material and is a U shape. The frame 15 has a base 150 and two supporting arms 151 bent from two ends of the base 150. The supporting arm 151 defines a through hole 152 engaging with the rib 14 of the first connector 10 to retain the frame 15 to the first connector 10. The supporting arm 151 further defines a first pivoting hole 153, a second pivoting hole 155 and a slot 154 between the first and the second pivot holes 153, 155. The first pivoting hole 153 is defined for assembling the first lever 17, and the second pivoting hole 155 is defined for assembling the second lever 19.

The locking member 16 is cut from a metal material and has a main body 160, a claw 161 extending backwardly from the main body 160, an extending arm 162 extending backwardly from the main body 160 and a supporting portion 163 extending forwardly from the main body 160. The extending arm 162 has a clasp 1620 at a rear end thereof, and the supporting portion 163 has a hook 1630 on a front end thereof, the claw 161 and the supporting portion 163 are located on two opposite sides of the main body 160, and the extending arm 162 and the claw 161 are located on the same side of the main body 160. The main body 160 defines a first circular hole 165 through which the first lever 17 passes through and a retaining hole 164 latching with the springs 5.

The first lever 17 is made from a metallic pole, and has a longitudinal operating portion 171, two pressing portions 172 bent rearward from two opposite ends of the operating portion 171 and two ends 170 bent inwardly from free ends of the pressing portions 172 and toward each other. The pressing portion 172 has a first part extending horizontally and a second part extending aslant from the first part. The two ends 170 are inserted into the first pivoting holes 153.

The second lever 19 is also made from a metallic pole, and has U-shape operating portion 191 and two ends 190 bent inwardly from two ends of the U-shape operating portion 191 and toward each other. The two ends 190 are inserted into the second pivoting holes 155.

The actuator 18 is cut from a metal material and has a main body 180, a pushing portion 181 inwardly and forwardly extending from the main body 180 toward the first and the second connectors 1, 2 and an actuating portion 182 extending rearward from the main body 180 and having a bending portion 1820 at a free end thereof The main body 180 defines a second circular hole 183 and a gap 184 above the second circular hole 183.

Referring to FIGS. 2-3, when assemble the electrical connector assembly 100, firstly, solder the first connector 1 on the printed circuit board 200, and mount the second connector 2 upon the first connector 1, put the frame 15 around the connectors 1, 2. Then make the ends 170 of the first lever 17 firstly pass through the first circular hole 165 of the locking member 16 and insert into the first pivoting hole 153 of the frame 15 so as to assemble the locking members 16 and the first lever 17 to two sides of an end of the frame 15. Next, latch one end of the spring 5 with the retaining hole 164 of the locking member 16, and latch the other end of the spring 5 to a gap (not labeled) defined on a front end of the supporting arm 151.

Finally, make the end 190 of the second lever 19 pass through the second circular hole 183 of the actuator 18, and the second pivoting hole 155 of the frame 15 so as to assemble the actuators 18 and the second lever 19 to two sides of another end of the frame 15. An assembly of the electrical connector assembly is completed. Conjoined with FIGS. 4-6, the pushing portion 181 passes through the slot 154 of the frame 15 to be located under the clump 24 of the second connector 2, the clasp 1620 of the extending arm 162 latches the gap 184 of the actuator 18. The pressing member 300 is retained to a top of the second connector 2 by retainers.

Figure 5:
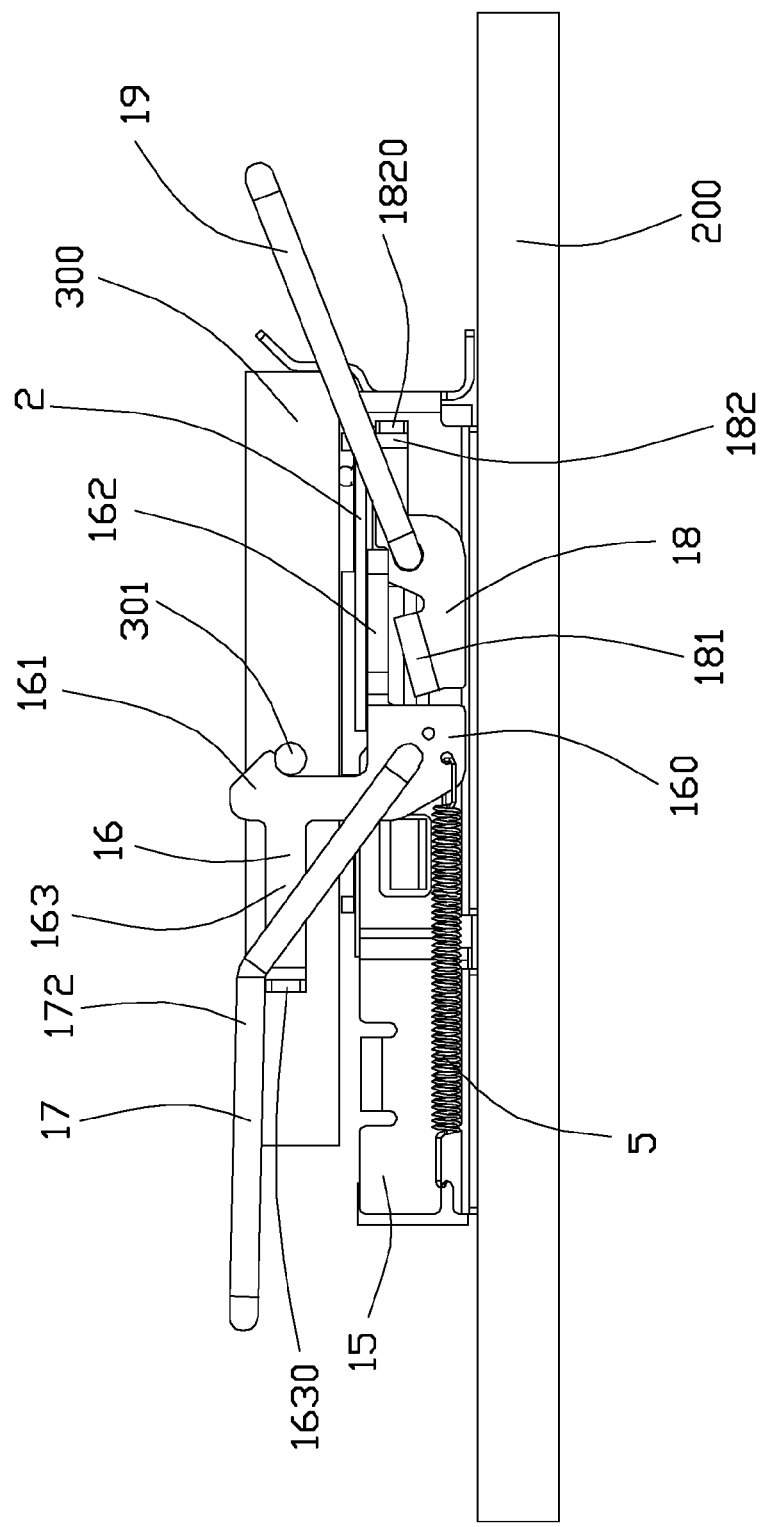
FIG. 5 is a side view of the electrical connector assembly with the pressing member in a closed status.
Figure 6:
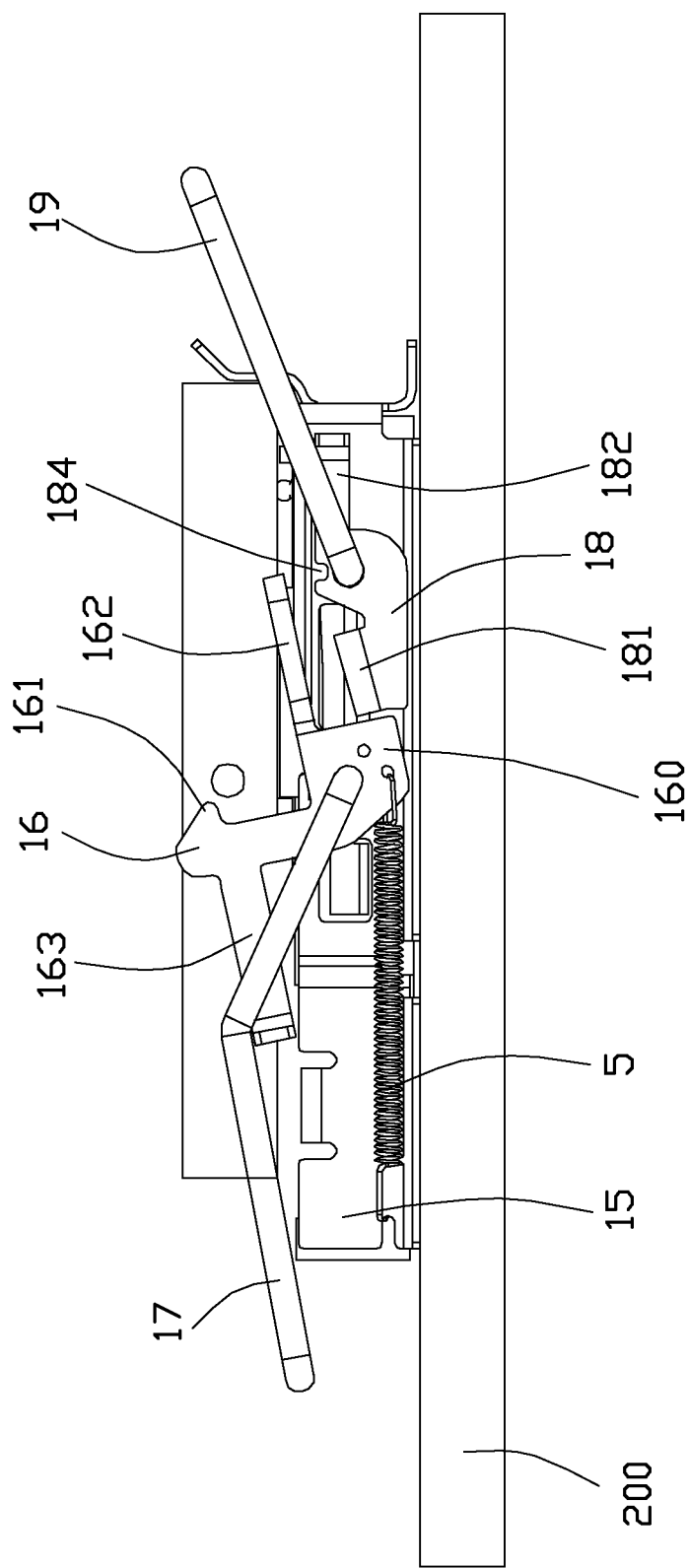
FIG. 6 is a side view of the electrical connector assembly with the pressing member in a middle status.
Figure 7:
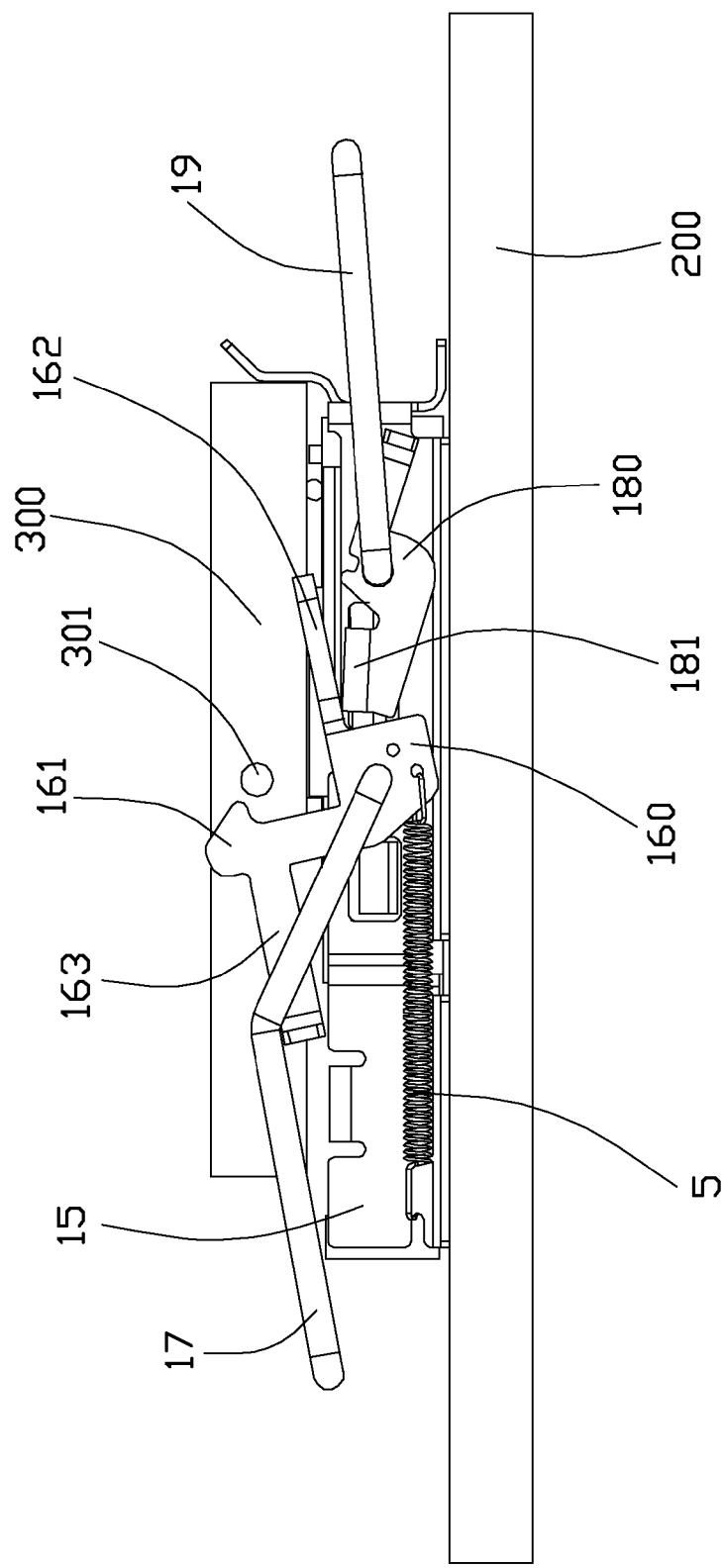
FIG. 7 is a side view of the electrical connector assembly with the pressing member in an open status.

Referring to FIGS. 5-7, when the electrical connector assembly 100 is at a closed status in FIG. 5, the pressing portion 172 seats on the hook 1630 of the supporting portion 163 of the locking member 16, the claw 161 of the locking member 16 locks a pole 301 formed on a side of the pressing member 300, the electrical connector assembly 100 at this status can work normally. When change the electrical connector assembly 100 from the closed status to an open status, downwardly press the operation portion 171 of the first lever 17, and bring the pressing portion 172 downwardly to press the supporting portion 163, then cause the locking member 16 rotates to release the pole 301 of the pressing member 300; at the same time, the clasp 1620 of the extending arm 162 leaves the gap 184 of the actuator 18, as show in FIG. 6, then pressing the U-shape operating portion 191 of the second lever 19, and bring the U-shape operating portion 191 press the bending portion 1820 of the actuating portion 182 and cause the actuator 18 to rotate, so the pushing member 181 upwardly push the clump 24 of the second connector 2 to apart the second connector 2 from the first connector 1. Release the first and the second levers 17, 19, the springs 5 force the locking member 16 to rotate back and then bring the actuator 18, the first and the second levers 17, 19 to restore.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An electrical connector assembly, adapted for receiving an IC package, comprising:
   a first body and a second body mounted onto the first body and used for receiving the IC package;
   a frame surrounding the first and the second bodies;
   a locking member having a main body, the main body defining a first circular hole;
   a first lever passing through the first circular hole of the locking member to pivot the locking member and itself to an end of the frame;
   an actuator defining a second circular hole and being locked by the locking member; and
   a second lever passing through the second circular hole of the actuator to pivot the actuator and itself to an end of the frame; wherein
   a downwardly movement of the first lever releases the actuator from the locking member and a further downwardly movement of the second lever brings the actuator to upwardly push the second body from the first body.

2. The electrical connector assembly as claimed in claim 1, wherein the locking member has a supporting portion and an extending arm extending from two opposite ends of the main body, and the extending arm latches the actuator; the first lever downwardly presses the supporting portion to bring the locking member to rotate around the first circular hole, and then the extending arm of the locking member release the actuator.

3. The electrical connector assembly as claimed in claim 2, wherein the first lever has a operating portion, two pressing portions bent rearward from two opposite ends of the operating portion and two ends bent inwardly from free ends of the pressing portions and toward each other, the pressing portion seats on the supporting portion of the locking member, the end passes through the locking member and inserts into first pivoting holes defined on the frame.

4. The electrical connector assembly as claimed in claim 2, wherein the actuator has a main body, a pushing portion inwardly and forwardly bent from the main body and an actuating portion extending rearward from the main body, the second lever seats on the actuating portion.

5. The electrical connector assembly as claimed in claim 4, wherein the actuating portion defines a gap on top side thereof, the extending arm of the locking member has a clasp at a free end thereof which latches with the gap of the actuator.

6. The electrical connector assembly as claimed in claim 5, wherein the second body is formed with a clump, the pressing portion upwardly pushes the clump to lift the second body.

7. The electrical connector assembly as claimed in claim 4, wherein the second lever has U-shape operating portion and two ends bent inwardly from two ends of the U-shape operating portion and toward each other, and the two ends pass through the actuator and insert into second pivoting holes defined on the frame.

8. The electrical connector assembly as claimed in claim 7, wherein the an actuating portion having a bending portion at a free end thereof, and the U-shape operating portion seats on the bending portion.

9. The electrical connector assembly as claimed in claim 1, further comprising a pressing member mounted upon the IC package received in the second body, the locking member further has a claw locking the pressing member.

10. The electrical connector assembly as claimed in claim 1, further comprising a spring disposed between the actuator and the frame.

11. An electrical connector assembly, adapted for engaging with a mating connector assembly, comprising:
a first connector for mating with the mating connector assembly;
a frame surrounding the first connector; and
a locking mechanism disposed onto the assembly, the locking mechanism having a locking member, a first lever pivot the locking member to the frame, an actuator, and a second lever pivot the actuator to the frame; wherein the actuator is latched by the locking member, the first lever presses the locking member to rotate and release the actuator, and then the second lever presses the actuator to rotate and urge apart the mating connector assembly from the first connector.

12. The electrical connector assembly as claimed in claim 11, wherein the locking member has a supporting portion and an extending arm extending from two opposite ends of the main body, and the first lever seats on the supporting portion, and the extending arm latches with a gap defined on a top edge of the actuator.

13. The electrical connector assembly as claimed in claim 12, wherein the actuator has a main body, a pushing portion forwardly extending from the main body and an actuating portion extending rearward from the main body, the second lever seats on the actuating portion.

14. The electrical connector assembly as claimed in claim 13, wherein the mating connector assembly has a second connector with a clump, the pushing portion upwardly pushes the clump to lift the mating connector assembly.

15. An electrical connector assembly comprising:
a printed circuit board;
a lower connector mounted upon the printed circuit board;
a frame locate around the lower connector;
a pressing member located above the first connector for holding an electronic package in position to contact the first connector between the pressing member and the printed circuit board;
an actuator movably mounted to the frame between opposite stationary and ejecting positions; and
a locking mechanism movably mounted to the frame between opposite unlocking and locking positions; wherein
when the locking mechanism is located at the locking position, the actuator is locked by the locking mechanism; when the locking mechanism is moved to the unlocking position, the actuator is released from the locking mechanism.

16. The electrical connector assembly as claimed in claim 15, wherein when said locking mechanism is located at the locking position, the pressing member is locked by said locking mechanism.

17. The electrical connector assembly as claimed in claim 15, wherein said locking mechanism is pivotally moved between the locking position and the unlocking position.

18. The electrical connector assembly as claimed in claim 15, wherein said actuator is moveable between the stationary and ejecting positions.

19. The electrical connector assembly as claimed in claim 15, wherein said actuator ejects the electronic package indirectly via an upper connector which is mated with the lower connector.

20. The electrical connector assembly as claimed in claim 15, wherein said locking mechanism is equipped with a spring to constantly urge the locking mechanism toward the locking position.

* * * * *